(12) United States Patent
Lim et al.

(10) Patent No.: US 9,726,789 B2
(45) Date of Patent: Aug. 8, 2017

(54) OPTICAL SHEET COMPRISING RANDOMLY AND NONPERIODICALLY DISTRIBUTED LIGHT-SCATTERING ELEMENTS, AND DISPLAY DEVICE INCLUDING OPTICAL SHEET

(71) Applicant: Samsung Display Co., LTD., Yongin, Gyeonggi-Do (KR)

(72) Inventors: Jae-Ik Lim, Hwaseong-si (KR); Won-Sang Park, Yongin-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 80 days.

(21) Appl. No.: 14/509,900

(22) Filed: Oct. 8, 2014

(65) Prior Publication Data

US 2015/0102325 A1 Apr. 16, 2015

(30) Foreign Application Priority Data

Oct. 14, 2013 (KR) .................. 10-2013-0121750

(51) Int. Cl.
*H01L 51/52* (2006.01)
*G02B 5/02* (2006.01)
*H01L 27/32* (2006.01)

(52) U.S. Cl.
CPC ......... *G02B 5/0242* (2013.01); *G02B 5/0268* (2013.01); *H01L 51/5268* (2013.01); *H01L 51/5281* (2013.01); *H01L 27/3244* (2013.01)

(58) Field of Classification Search
CPC ............ H01L 51/5268; H01L 51/5281; G02B 5/0242
See application file for complete search history.

(56) References Cited

U.S. PATENT DOCUMENTS

| 7,072,544 | B2 | 7/2006 | Cornelissen et al. |
| 7,776,424 | B2 | 8/2010 | Chuang et al. |
| 8,339,538 | B2 | 12/2012 | Uehara et al. |
| 2004/0047042 | A1* | 3/2004 | Takahashi ............ G02B 5/0242 359/599 |
| 2006/0104084 | A1* | 5/2006 | Amemiya .............. G02B 5/003 362/561 |
| 2006/0125387 | A1* | 6/2006 | Adachi ............... H01L 51/5088 313/506 |
| 2008/0043455 | A1* | 2/2008 | Chang .................. G02B 5/0215 362/23.18 |
| 2009/0009861 | A1 | 1/2009 | Hyobu |

(Continued)

FOREIGN PATENT DOCUMENTS

| KR | 10-2009-0073467 | 7/2009 |
| KR | 10-2013-0125565 | 11/2013 |

*Primary Examiner* — Eduardo A Rodela
*Assistant Examiner* — Christopher M Roland
(74) *Attorney, Agent, or Firm* — Innovation Counsel LLP

(57) ABSTRACT

An optical sheet includes a transparent substrate. The optical sheet further includes light-scattering elements randomly and nonperiodically distributed in the transparent substrate. Each light-scattering element of the light scattering elements includes a binding-material member and light-scattering particles dispersed in the binding-material member. A weight percent calculated from dividing a total weight of light-scattering particles of the light-scattering elements by a total weight of the light-scattering elements is in a range of 5 wt % to 40 wt %.

10 Claims, 7 Drawing Sheets

(56) References Cited

U.S. PATENT DOCUMENTS

| | | | |
|---|---|---|---|
| 2011/0050668 A1* | 3/2011 | Park | G09G 3/3426 345/211 |
| 2011/0242463 A1 | 10/2011 | Park et al. | |
| 2012/0013987 A1 | 1/2012 | Oki | |
| 2015/0043080 A1* | 2/2015 | Lim | G02B 5/0221 359/599 |
| 2015/0205015 A1* | 7/2015 | Tsuji | G09F 19/14 359/599 |

* cited by examiner

OPTICAL SHEET COMPRISING RANDOMLY AND NONPERIODICALLY DISTRIBUTED LIGHT-SCATTERING ELEMENTS, AND DISPLAY DEVICE INCLUDING OPTICAL SHEET

CROSS-REFERENCE TO RELATED APPLICATION

This application claims priority under 35 USC §119 to and benefit of Korean Patent Application No. 10-2013-0121750 filed on Oct. 14, 2013 in the Korean Intellectual Property Office (KIPO), the entire disclosure of which is incorporated herein by reference.

BACKGROUND

1. Field

The present invention is related to an optical sheet, a display device that includes an optical sheet, and a method for manufacturing an optical sheet.

2. Description of the Related Art

A display device, for example, an organic light emitting display (OLED) device, may include an organic light emitting layer disposed between a cathode and an anode. When a voltage is applied between the cathode and the anode, holes and electrons may be combined to form excitons in the organic light emitting layer. A light may be generated when a state of the excitons is changed from an excited state to a ground state.

The OLED device may have several advantages, for example, a wide viewing angle, a short response time, a thin thickness, and/or low power consumption. Nevertheless, the OLED device may have a broad light emitting wavelength and a random light orientation, such that the OLED device may have a relatively low light emitting efficiency. In order to improve the light emitting efficiency of the OLED device, a light extraction structure or a resonance structure may be implemented in the OLED device. The additional structure may cause color-shifts at different viewing angles.

SUMMARY

Some example embodiments of the present invention are related to an optical sheet configured for minimizing color-shift and optimizing image visibility associated with a display device. Some example embodiments are related to a display device that includes the optical sheet. Some example embodiments are related to a method for manufacturing the optical sheet.

Some example embodiments of the present invention are related to an optical sheet that may include a transparent substrate. The optical sheet may further include light-scattering elements randomly and nonperiodically distributed in (or inside) the transparent substrate. Each light-scattering element of the light scattering elements may include a binding-material member and light-scattering particles dispersed in (or inside) the binding-material member. A weight percent calculated from dividing a total weight of light-scattering particles of the light-scattering elements by a total weight of the light-scattering elements may be in a range of 5 wt % to 40 wt %.

In example embodiments, the weight percent is in a range of 5 wt % to 20 wt %.

In example embodiments, a ratio calculated from dividing an average width of the light-scattering elements in cross-sections of the optical sheet by an average distance of immediately neighboring light-scattering elements of the light-scattering elements in cross-sections of the optical sheet is in a range of 1/20 to 3/8.

In example embodiments, the unit of a thickness value of the optical sheet is μm, the unit of a value of the weight percent is wt %, and a configuration value calculated from dividing a product of the thickness value of the optical sheet, the value of the weight percent, and an average width of the light-scattering elements by an average distance of immediately neighboring light-scattering elements of the light-scattering elements is in a range of 80 to 100.

In example embodiments, the configuration value is in a range of 80 to 90.

In example embodiments, top surfaces of the light-scattering elements are flush with a top surface of the transparent substrate, and bottom surfaces of the light-scattering elements are flush with a bottom surface of the transparent substrate.

In example embodiments, top surfaces of the light-scattering elements are flush with a top surface of the transparent substrate, and bottom surfaces of the light-scattering elements are flush are positioned between a bottom surface of the transparent substrate and the top surfaces of the light-scattering elements.

In example embodiments, the light-scattering elements are disposed between a top surface of the transparent substrate and a bottom surface of the transparent substrate in at least a direction perpendicular to the bottom surface of the transparent substrate.

Some example embodiments of the present invention are related to a method for manufacturing an optical sheet. The method may include the following steps: randomly distributing light-scattering elements on a carrier film; forming a transparent member on the carrier film such that the light-scattering elements are randomly and nonperiodically distributed in (or inside) the transparent member; and separating a combination of the transparent member and the light-scattering elements from the carrier film.

In example embodiments, each light-scattering element of the light-scattering elements includes a binding-material member and light-scattering particles dispersed in (or inside) the binding-material member.

In example embodiments, a weight percent calculated from dividing a total weight of light-scattering particles of the light-scattering elements by a total weight of the light-scattering elements is in a range of 5 wt % to 40 wt %.

In example embodiments, the light-scattering elements includes a first light-scattering element and a second light-scattering element immediately neighboring the first light-scattering element, and an imaginary line connecting a center of the first light-scattering element and a center of the second light-scattering element is at an acute angle with respect to an edge of the transparent member.

In example embodiments, the method may include the following step: before the step of separating, removing a portion of the transparent member to expose the light-scattering elements.

In example embodiments, the method of may include the following steps: after the step of separating, attaching a first surface of the transparent member to the carrier film, wherein the light-scattering elements includes a first light-scattering element, wherein the first light-scattering element includes a first side and a second side, and wherein the first side is positioned between the second side and the first surface of the transparent member; and providing a transparent layer on a second surface of the transparent member and the second side of the first light-scattering element (such that the transparent layer directly contacts both the second surface of the transparent member and the second side of the first light-scattering element).

In example embodiments, the transparent layer and the transparent member include a same material and combine to form a transparent substrate of the optical sheet.

In example embodiments, the method may include the following step: performing a photo-curing process on the transparent member, wherein the transparent member includes a polymer material.

In example embodiments, the carrier film includes a base film and a release film overlapping the base film, and the light-scattering elements and the transparent member contact the release film.

Some example embodiments are related to a display device. The display device may include the following elements: a first electrode; an organic light emitting layer overlapping the first electrode; a second electrode overlapping the organic light emitting layer; and an optical sheet overlapping the second electrode. The optical sheet may include the following elements: a transparent substrate; and light-scattering elements randomly and nonperiodically distributed in the transparent substrate. Each light-scattering element of the light scattering elements may include a binding-material member and light-scattering particles dispersed in the binding-material member. A weight percent calculated from dividing a total weight of light-scattering particles of the light-scattering elements by a total weight of the light-scattering elements may be in a range of 5 wt % to 40 wt %.

In example embodiments, the unit of a thickness value of the optical sheet is μm, the unit of a value of the weight percent is wt %, and a configuration value calculated from dividing a product of the thickness value of the optical sheet, the value of the weight percent, and an average width of the light-scattering elements by an average distance of immediately neighboring light-scattering elements of the light-scattering elements may be in a range of 80 to 100.

In example embodiments, a portion of the transparent substrate is disposed between the organic light emitting layer and the light-scattering elements.

Some example embodiments may be related to an optical sheet. The optical sheet includes a transparent substrate and scattering patterns (or light-scattering patterns). The scattering patterns are randomly formed in the transparent substrate in a non-periodic distribution. Each scattering pattern of the scattering patterns includes a scattering layer (or binding-material layer) and scattering particles (or light-scattering particles) dispersed therein. A weight percent of the scattering particles of the scattering patterns based on a total weight of the scattering patterns is in a range of from about 5 wt % to about 40 wt %.

In example embodiments, the weight percent of the scattering particles may be in a range of from about 5 wt % to about 20 wt %.

In example embodiments, a value of Wba/Waa may be in a range of from about 1/20 to about 3/8. Wba represents an average width of the scattering patterns, and Waa represents an average distance between immediately neighboring scattering patterns.

In example embodiments, a configuration value of T*(wt %)*(Wba/Waa) may be in a range of from about 80 to about 100. T represents a thickness (in μm) of the optical sheet, Wba represents an average width of the scattering patterns, Waa represents an average distance between immediately neighboring scattering patterns, and wt % represents a value of the weight percent of the scattering particles.

In example embodiments, the configuration value may be in a range of from about 80 to about 90.

In example embodiments, the scattering patterns may be formed through the transparent substrate and may be exposed by upper and lower surfaces of the transparent substrate.

In example embodiments, the scattering patterns may be buried in the transparent substrate, and one surface of each scattering pattern may be exposed by an upper surface of the transparent substrate.

In example embodiments, the scattering patterns may be completely buried inside the transparent substrate.

Some example embodiments may be related to a method for manufacturing an optical sheet. In the method, a scattering layer composition is stamped (or provided) randomly on a carrier film to form scattering patterns having a non-periodic distribution. A transparent substrate is formed on the carrier film to cover the scattering patterns. Subsequently, a combination of the transparent substrate and the scattering patterns is separated from the carrier film.

In example embodiments, the scattering layer composition may be prepared by dispersing scattering particles in a binder resin.

In example embodiments, a weight percent of the scattering particles based on a total weight of the scattering layer composition may be in a range of from about 5 wt % to about 40 wt %.

In example embodiments, the weight percent of the scattering particles may be in a range of from about 5 wt % to about 20 wt %.

In example embodiments, an upper portion of the transparent substrate may be polished to expose the scattering patterns prior to separating the transparent substrate from the carrier film.

In example embodiments, one surface of the transparent substrate covering the scattering patterns may be attached to the carrier film after separating the transparent substrate from the carrier film. The scattering patterns and the other surface of the transparent substrate may be coated using a transparent resin material.

In example embodiments, the transparent resin material may be merged with the transparent substrate.

In example embodiments, in the step of forming the transparent substrate, a transparent polymer layer may be formed on the carrier film to cover the scattering patterns. A photo-curing process may be performed on the transparent polymer layer.

In example embodiments, the carrier film may include a base film and a release film formed on the base film.

Some example embodiments may be related to a display device. The display device includes a first electrode on a substrate, an organic light emitting layer on the first electrode, a second electrode on the organic light emitting layer, and an optical sheet on the second electrode. The optical sheet includes a transparent substrate and scattering patterns. The scattering patterns are randomly formed in the transparent substrate in a non-periodic distribution. Each scattering pattern of the scattering patterns includes a scattering layer and scattering particles dispersed therein. A weight percent of the scattering particles of the scattering patterns based on a total weight of the scattering patterns is in a range of from about 5 wt % to about 40 wt %.

In example embodiments, a value of T*(wt %)*(Wba/Waa) may be in a range of from about 80 to about 100. T represents a thickness (in μm) of the optical sheet, Wba represents an average width of the scattering patterns, Waa represents an average distance between immediately neighboring scattering patterns, and wt % represents a value of the weight percent of the scattering particles.

In example embodiments, the display device may further include a polarization film on the optical sheet, or between the second electrode and the optical sheet.

According to example embodiments, an optical sheet may include light-scattering patterns randomly distributed in a transparent substrate, so that a display device including the optical sheet may have optimized color-shift and image visibility. A weight percent of scattering particles included in the scattering patterns, a thickness of the optical sheet, and an average width and an average distance of the scattering patterns may be adjusted to optimize both the color-shift and the transmittance efficiency associated with a display device.

DETAILED DESCRIPTION OF THE EMBODIMENTS

Figure 1A:
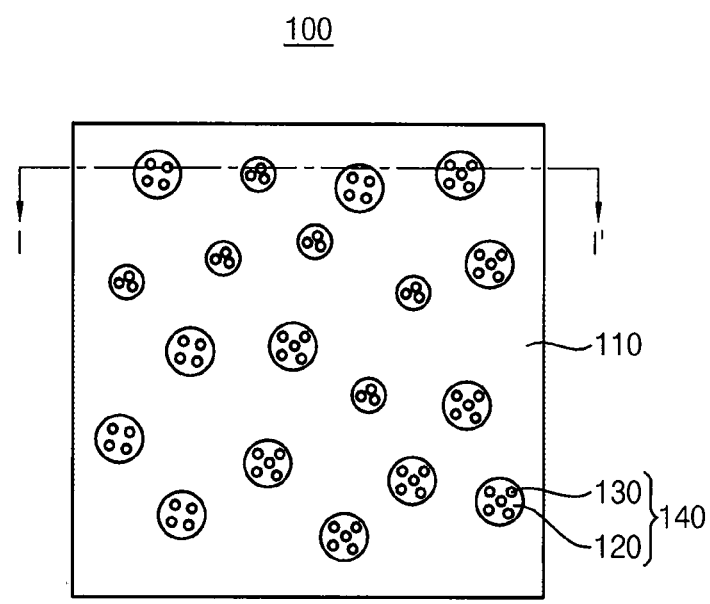
FIGS. 1A and 1B are a top plan view and a cross-sectional view, respectively, illustrating an optical sheet in accordance with example embodiments of the present invention.

Various example embodiments will be described more fully hereinafter with reference to the accompanying drawings. The present invention may be embodied in many different forms and should not be construed as limited to the example embodiments set forth herein. In the drawings, the sizes and relative sizes of layers and regions may be exaggerated for clarity. Like numerals may refer to like elements.

Although the terms "first", "second", etc. may be used herein to describe various elements, these elements should not be limited by these terms. These terms are used to distinguish one element from another. Thus, a first element discussed below could be termed a second element without departing from the teachings of the present invention. The description of an element as a "first" element may not require or imply the presence of a second element or other elements. The terms "first," "second," etc. may also be used herein to differentiate different categories of elements. For conciseness, the terms "first", "second", etc. may represent "first-type (or first-category)", "second-type (or second-category)", etc., respectively.

As used herein, the term "and/or" includes any and all combinations of one or more of the associated items.

If an element is referred to as being "contacting", "connected to", or "coupled to" another element, it can be directly contacting, directly connected to, or directly coupled to the other element, or one or more intervening elements may be present. If an element is referred to as being "directly contacting", "directly connected to", or "directly coupled to" another element, there are no intended intervening elements (except possible environmental elements) present.

The terminology used herein is for the purpose of describing particular example embodiments and is not intended to limit the scope of the present invention.

As used herein, the singular forms "a", "an", and "the" may include the plural forms as well, unless the context clearly indicates otherwise. The terms "comprises" and/or "comprising", when used in this specification, specify the presence of stated features, integers, steps, operations, elements, and/or components, but do not preclude the presence or addition of one or more other features, integers, steps, operations, elements, components, and/or groups.

Unless otherwise defined, all terms (including technical and scientific terms) used herein have the same meaning as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

Figure 1B:
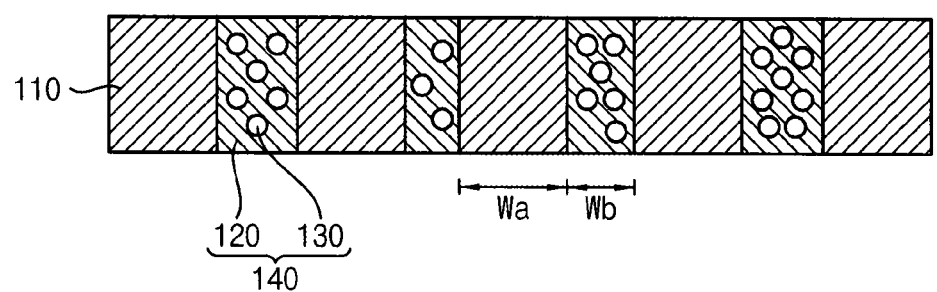

FIGS. 1A and 1B are a top plan view and a cross-sectional view, respectively, illustrating an optical sheet 100 in accordance with example embodiments of the present invention. Specifically, FIG. 1B is a cross-sectional view taken along a line I-I' indicated in FIG. 1A. The optical sheet 100 may be included in a display device.

Referring to FIGS. 1A and 1B, the optical sheet 100 may include a transparent substrate 110 and scattering patterns 140 (or light-scattering elements 140) distributed in the transparent substrate 110. A scattering pattern 140 may include scattering particles 130 (or light-scattering particles 130) dispersed in a scattering layer 120 (or binding-material layer 120).

The transparent substrate 110 may include, for example, a transparent resin having light-transmissive properties. The transparent substrate 110 may include one or more of a cellulose based resin such as triacetyl cellulose (TAC), a polyester based resin such as polyethylene terephthalate (PET), and a transparent polymer such as polycarbonate, polyvinyl chloride (PVC), polyimide, or urethane.

The scattering particles 130 may be mixed and/or dispersed in the scattering layer 120. The scattering layer 120 may include a binder material to which the scattering particles 140 are fixed. In example embodiments, the scattering layer 120 may include a photo-curable resin. For example, the scattering layer 120 may include polyimide, a siloxane based resin, benzocyclobutene (BCB), and/or an acryl based resin.

The scattering particles 130 may include inorganic particles such as silica, titanium dioxide ($TiO_2$), and/or zirconium dioxide ($ZrO_2$). Alternatively or additionally, the scattering particles 130 may include polymer particles such as polystyrene or polymethylmethacrylate (PMMA).

In example embodiments, the scattering patterns 140 may be arranged randomly in the transparent substrate 110. For example, the scattering patterns 140 may not have a periodic or regular arrangement, such as line patterns, grating patterns, or honeycomb shaped patterns, but may have an irregular or non-periodic arrangement. In at least a direction parallel to a top surface of the optical sheet 100, distances between immediately neighboring scattering patterns 140 may be different. For example, in a direction parallel to the top surface of the optical sheet 100, the distance between a first scattering pattern 140 and a second scattering pattern 140 immediately neighboring the first scattering pattern 140 may be unequal to the distance between the second scattering pattern 140 and a third scattering pattern 140 immediately neighboring the second scattering pattern 140. The scattering patterns 140 may have different sizes and/or may include different amounts of scattering particles 130. For example, the first scattering pattern 140 may be larger than the second scattering pattern 140 and/or may include more scattering particles 130 than the second scattering pattern 140. The scattering patterns 140 may have a random arrangement so that a display device, e.g., an OLED device employing the optical sheet 100 and other layers, may have a minimized moire interference, wherein the scattering patterns 140 may overlap various patterns in the display device.

A scattering pattern 140 may have a substantially circular cross-section, as illustrated in FIG. 1A. In some embodiments, a scattering pattern 140 may have one or more different cross-sectional shapes, e.g., one or more polygonal shapes, including one or more of a triangle shape, a rectangular shape, a hexagonal shape, etc.

As illustrated in FIG. 1B, the scattering pattern 140 may be exposed through (and/or at) upper and/or lower surfaces of the transparent substrate 110.

In a display device that includes the optical sheet 100, light may be scattered laterally by the scattering patterns 140, so that color-shift of the display device may be minimized. A substantial portion of the light may penetrate through the transparent substrate 110 of the optical sheet 100, so that loss of brightness of the display device may be minimized.

In example embodiments, a weight percent (wt %) of the scattering particles 130 with respect to a total weight of the scattering patterns 140 may be in a range of about 5 wt % to about 40 wt %. If the weight percent of the scattering particles 130 is less than about 5 wt %, the color-shift of the display device may be substantially perceivable and may be unacceptable. If the weight percent of the scattering particles 130 is greater than about 40 wt %, transparency of the optical sheet 100 may be substantially low so that image visibility of the display device may be unsatisfactory. In example embodiments, the weight percent of the scattering particles 130 may be in a range from about 5 wt % to about 20 wt %.

As illustrated in FIG. 1B, in a (lengthwise or widthwise) cross-section of the optical sheet 100, a width of a scattering pattern 140 may be represented by "Wb," and a width of a portion of the transparent substrate 110 between two immediately neighboring scattering patterns 140 may be represented by "Wa". In example embodiments, a ratio of an average width of the scattering patterns 140 to an average width of portions of the transparent substrate 110 (or average distance) between two immediately neighboring scattering patterns in cross-sections of the optical sheet 100 (hereinafter referred to as "Wba/Waa") may be in a range from about 1/20 to about 3/8. If the Wba/Waa is less than about 1/20, the color-shift of the display device may be substantially perceivable and may be unacceptable. If Wba/Waa is greater than about 3/8, transparency of the optical sheet 100 may be substantially low, so that front brightness and/or image visibility of the display device may be unsatisfactory.

In example embodiments, a thickness of the optical sheet 100 may be in a range of about 50 μm to about 80 μm. If the thickness of the optical sheet 100 is less than about 50 μm, a probability of scattering a sidelight may be substantially low, so that the color-shift of the display device may be substantially perceivable and may be unacceptable. If the thickness of the optical sheet 100 is greater than about 80 μm, a total path of a light transmitted by the display device may be undesirably large, so that the brightness and/or image visibility of the display device may be unsatisfactory.

As Wba/Waa becomes larger, the probability of scattering the sidelight may increase, so that color-shift of an image may decrease and that the transparency of the optical sheet 100 may decrease. In example embodiments, the weight percent of the scattering particles 130 may be low, and the Wba/Waa of the optical sheet 100 may be sufficiently large to reduce the color-shift of the display device to a desired level.

As the thickness of the optical sheet 100 becomes larger, the probability of scattering the sidelight may increase, so that the color-shift may be reduced. Nevertheless, if the thickness of the optical sheet 100 is excessively large, the total path of the light transmitted by the display device may be undesirably large so that the image display quality of the display device may be unsatisfactory.

In example embodiments, the weight percent of the scattering particles 130, the Wba/Waa of the optical sheet 100, the thickness of the optical sheet 100 may be simultaneously optimized. Advantageously, the color-shift of the display device may be minimized and may be substantially acceptable.

In example embodiments, a value obtained from multiplying the thickness of the optical sheet (μm), the weight percent of the scattering particles (wt %), and Wba/Waa, hereinafter referred to as "T*(wt %)*(Wba/Waa)", may be maintained in a predetermined range, so that both the transparency of the optical sheet 100 and the color-shift associated with display device may be optimized.

In example embodiments, the value of T*(wt %)*(Wba/Waa) may be in a range from about 80 (μm %) to about 100 (μm %). In example embodiments, the value of T*(wt %)*(Wba/Waa) may be in a range from about 80 (μm %) to about 90 (μm %).

Figure 2:
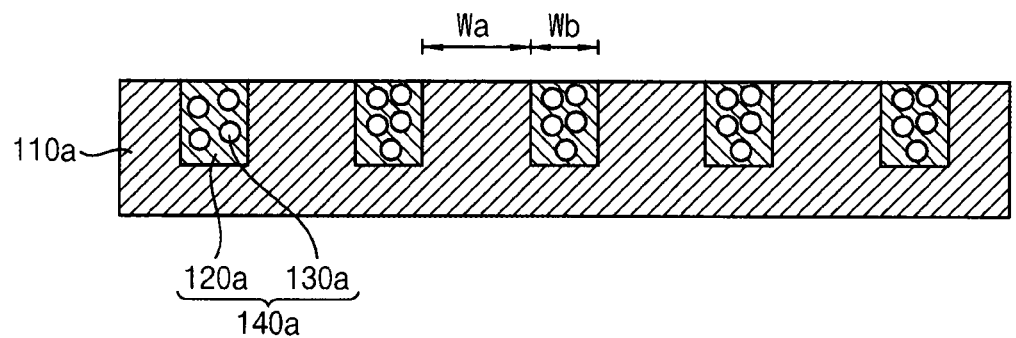
FIGS. 2 and 3 are cross-sectional views illustrating optical sheets in accordance with examples embodiments of the present invention.
Figure 3:
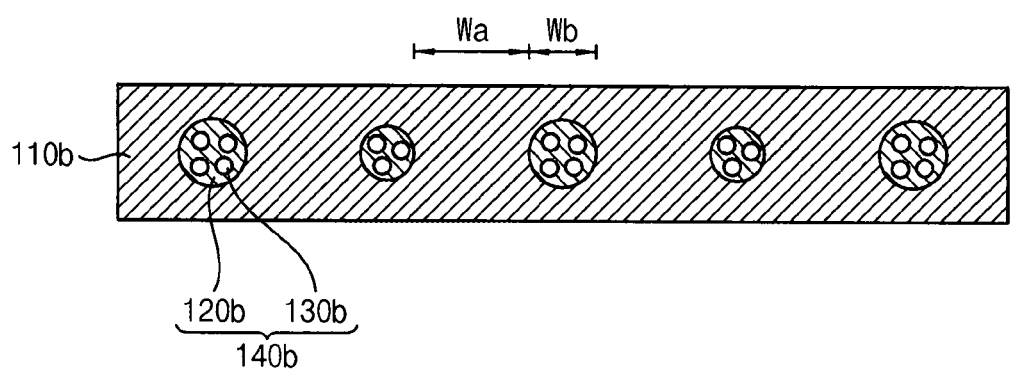

FIGS. 2 and 3 are cross-sectional views illustrating optical sheets 100a and 100b, respectively, in accordance with examples embodiments of the present invention.

Referring to FIG. 2, a scattering pattern 140a (or light-scattering element 140a) of the optical sheet 100a may include a scattering layer 120a (or binding-material layer 120a) and scattering particles 130a (or light-scattering particles 130a). The scattering pattern 140a may be buried or embedded in a transparent substrate 110a, and an upper surface of the scattering pattern 140a may be exposed through a top surface of the transparent substrate 110a. A width of the scattering pattern 140a may be represented by "Wb". and a width of a portion of the transparent substrate 110a between two immediately neighboring scattering patterns 140a may be represented by "Wa" and may be measured at the top surface of the transparent substrate 110a. In example embodiments, Wba/Waa may be in a range from about 1/20 to about 3/8. In example embodiments, the weight percent of the scattering particles 130a, the Wba/Waa of the optical sheet 100a, the thickness of the optical sheet 100a may be simultaneously optimized, for optimizing the transparency and color-shift of a display device that includes the optical sheet 100a.

Referring to FIG. 3, a scattering pattern 140b (or light-scattering element 140b) of the optical sheet 100b may include a scattering layer 120b (or binding-material layer 120b) and scattering particles 130b (or light-scattering particles 130b). The scattering pattern 140b may be completely buried or embedded in the transparent substrate 110b. The scattering pattern 140b may have a substantially spherical shape, as illustrated in FIG. 3. "Wb" may represent a diameter (or the maximum width) of a scattering pattern 140b (in a cross-section of the optical sheet 100b), and "Wa" may represent a distance of two immediately neighboring scattering patterns 140b (in the cross-section of the optical sheet 100b). In example embodiments, the scattering pattern 140b may have a substantially cylindrical shape or a substantially pillar shape having a polygonal cross-section. In example embodiments, Wba/Waa may be in a range from about 1/20 to about 3/8. In example embodiments, the weight percent of the scattering particles 130a, the Wba/Waa of the optical sheet 100a, the thickness of the optical sheet 100a may be simultaneously optimized, for optimizing the transparency and color-shift of a display device that includes the optical sheet 100a.

FIGS. 4 to 7 include cross-sectional views illustrating a method for manufacturing an optical sheet in accordance with example embodiments of the present invention.

Figure 4:
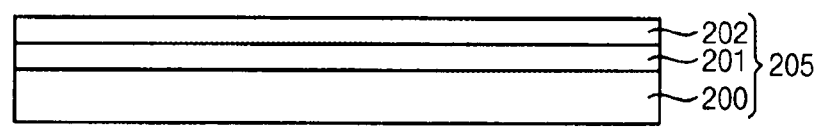
FIGS. 4, 5A, 5B, 6, and 7 include cross-sectional views illustrating a method for manufacturing an optical sheet in accordance with example embodiments of the present invention.

Referring to FIG. 4, a carrier film 205 may be prepared. In example embodiments, the carrier film 205 may include a base film 200 and a release film 202 formed on the base film 200 and/or overlapping the base film 200. The base film 200 may include, e.g., a metal foil. The release layer 202 may be configured to facilitate detachment of a structure from the carrier film 205. The release layer 202 may include, e.g., a silicon based film or an epoxy based film. In example embodiments, an adhesion layer 201 may be provided between the base film 200 and the release layer 202 for binding the release layer 202 to the base film 200.

In example embodiments, the adhesion layer 201 may be omitted. In example embodiments, the carrier film 205 may include a base film 200 without including a release layer 202 or an adhesion layer 201.

Figure 5A:
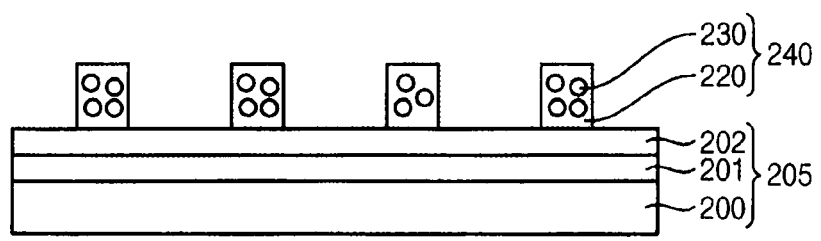

Referring to FIG. 5A, scattering patterns 240 (or light-scattering elements 240) may be formed on the carrier film 205.

In example embodiments, scattering particles 230 (or light-scattering particles 230) may be dispersed in a binder resin, which may represent a scattering layer composition for forming a scattering layer 220 (or binding-material layer 220). The scattering layer composition may be prepared as a solution or a paste. In example embodiments, a solvent for dissolving the scattering layer composition may be used.

The binder resin may include, e.g., one or more of a polyimide-based resin, an acryl-based resin, BCB, and a siloxane-based resin. These materials may be used alone, or some of the materials may be used in combination. The scattering particles 230 may include one or more inorganic materials, such as one or more of silica, titanium dioxide, and zirconium dioxide. These materials may be used alone, or some of the materials may be used in combination. Alternatively or additionally, the scattering particles 230 may include one or more organic materials, such as polystyrene and/or PMMA. The solvent may include an organic solvent such as an alcohol-based solvent or a ketone-based solvent The scattering layer composition may be stamped (and/or provided) on the carrier film 205 through, e.g., an inkjet printing process or an offset printing process to form the scattering patterns 240. The scattering patterns 240 may include the scattering layer 220 (formed of the scattering layer composition) and the scattering patterns 230 dispersed in the scattering layer 220.

Figure 5B:
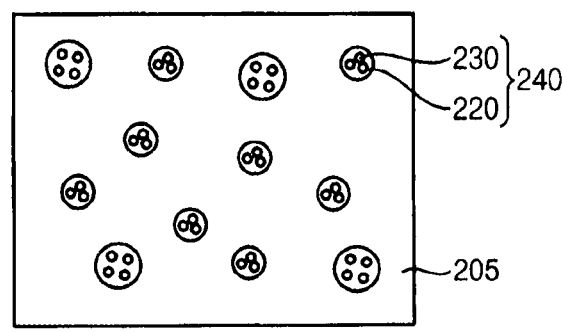

FIG. 5B illustrates a top plan view of the structure illustrated in FIG. 5A in accordance with example embodiments of the present invention. Referring to FIG. 5B, the scattering patterns 240 may be stamped (and/or provided) randomly in a non-periodic arrangement on the carrier film 205.

As illustrated in FIGS. 5A and 5B, the scattering patterns 240 may have a substantially cylindrical pillar shape. In example embodiments, the scattering patterns 240 may have a substantially polygonal pillar shape and/or a substantially spherical shape.

In one example embodiment, a photo-curing process using, e.g., ultraviolet (UV) rays may be performed to cure the scattering layer 220 after the scattering patterns 240 have been stamped (and/or provided) on the carrier film 205.

Figure 6:
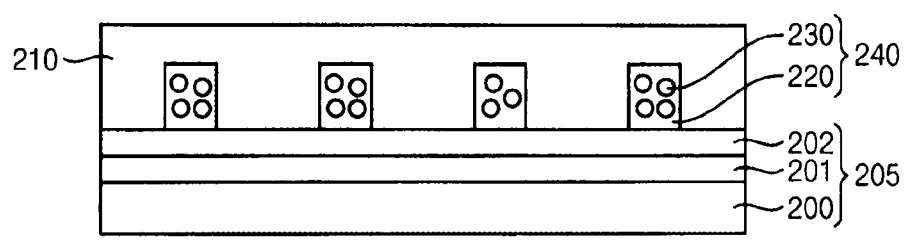

Referring to FIG. 6, a transparent substrate 210 may be formed on the carrier film 205 to cover the scattering patterns 240. In example embodiments, a transparent polymer layer may be formed on the carrier film 205 to cover the scattering patterns 240. The transparent polymer layer may be formed using, e.g., a cellulose based resin such as TAC, a polyester based resin such as PET, polycarbonate, PVC, polyimide, or urethane. A photo-curing process using, e.g., UV rays may be performed to form the transparent substrate 210. Accordingly, the scattering patterns 240 may be buried in the transparent substrate 210.

In example embodiments, a planarization process may be further performed on a surface of the transparent substrate 210 distant from a top surface of the carrier film 205.

Figure 7:
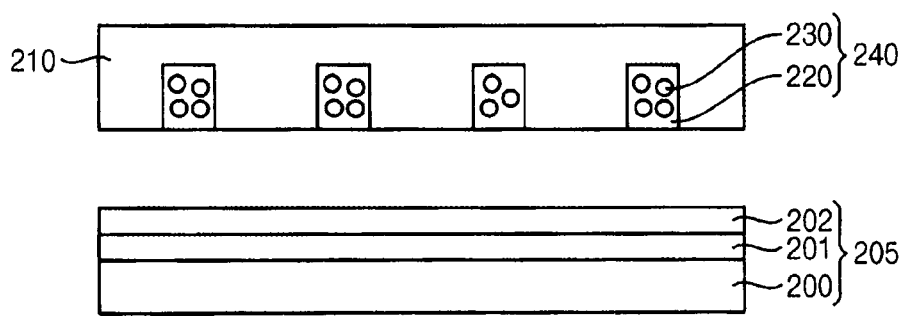

Referring to FIG. 7, the transparent substrate 210 including (and/or enclosing) the scattering patterns 240 may be separated from the carrier film 205. In example embodiments, contact portions of the transparent substrate 210 and the carrier film 205 may be cut, and then the carrier film 205 may be detached from the transparent substrate 210. At least a portion of the structure separated from the carrier film 205, including at least a portion of the transparent substrate 210, and including at least a portion of the scattering patterns 240 may be utilized as an optical sheet in accordance with example embodiments. The optical sheet may have a structure substantially identical to or similar to that illustrated FIG. 2. In example embodiments, the scattering patterns 240 may be buried in the transparent substrate 210 and may be exposed at a surface of the transparent substrate 210.

In example embodiments, a planarization process or a surface treatment process using, e.g., a plasma may be performed on one or more surfaces of the optical sheet. Defects, such as protrusion or recesses of the optical sheet, may be removed.

Figure 8:
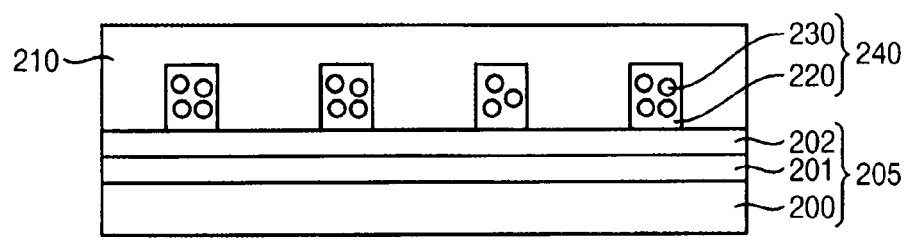
FIGS. 8 and 9 are cross-sectional views illustrating a method for manufacturing an optical sheet in accordance with example embodiments of the present invention.
Figure 9:
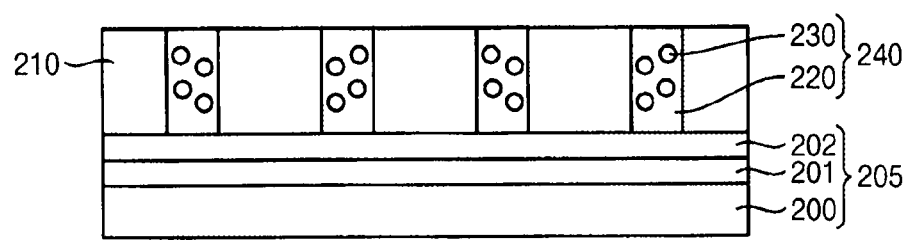

FIGS. 8 and 9 are cross-sectional views illustrating a method for manufacturing an optical sheet in accordance with example embodiments of the present invention.

Referring to FIG. 8, processes substantially identical to or similar to those described with reference to FIGS. 4 to 6 may be performed. Accordingly, a transparent substrate 210 covering scattering patterns 240 may be formed on a carrier film 205.

Referring to FIG. 9, an upper portion of the transparent substrate 210 may be polished until upper surfaces of the scattering patterns 240 may be exposed. Subsequently, the transparent substrate 210 including (and/or enclosing) the scattering patterns 240 may be separated from the carrier film 205. At least a portion of the structure separated from the carrier film 205 may be utilized as an optical sheet in accordance with example embodiments. For example, the optical sheet may have a structure substantially identical to or similar to that illustrated in FIGS. 1A and 1B. In example embodiments, the scattering patterns 240 may be exposed at upper and lower surfaces of the transparent substrate 210. In example embodiments, a plasma treatment may be performed on upper and lower surfaces of the optical sheet.

Figure 10:
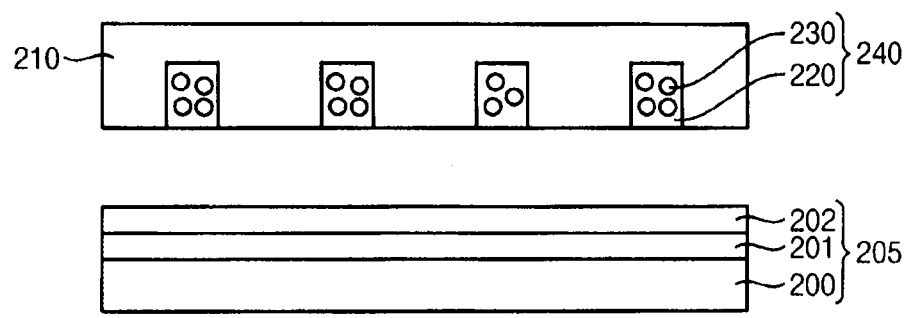
FIGS. 10 to 12 are cross-sectional views illustrating a method of manufacturing an optical sheet in accordance with example embodiments of the present invention.
Figure 11:
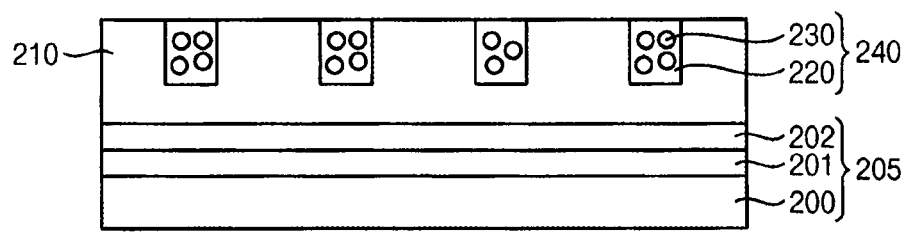
Figure 12:
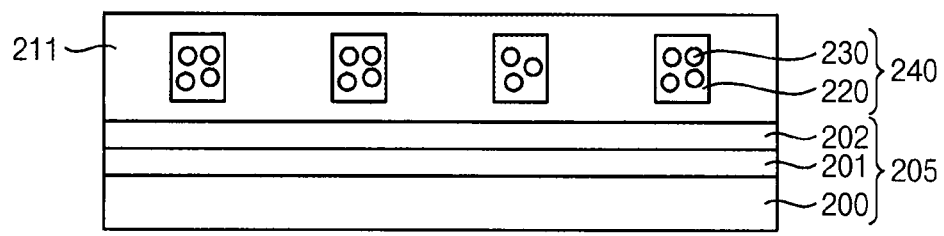

FIGS. 10 to 12 are cross-sectional views illustrating a method for manufacturing an optical sheet in accordance with example embodiments of the present invention Referring to FIG. 10, processes substantially identical to or similar to those described with reference to FIGS. 4 to 7 may be performed. Accordingly, a structure including a transparent substrate 210 and scattering patterns 240 that are buried in the transparent substrate 210 and exposed through one surface of the transparent substrate 210 may be separated from a carrier film 205.

Referring to FIG. 11, the other surface of the transparent substrate 210, which does not expose the scattering patterns 240, may be attached on the carrier film 205.

Referring to FIG. 12, a transparent polymer layer may be formed on the transparent substrate 210 using, e.g., one or more of the above mentioned cellulose based resin, polyester based resin, polycarbonate, PVC, polyimide, and urethane to cover the exposed scattering patterns 240. The transparent polymer layer may merge with the transparent substrate 210 to form a transparent substrate 211.

Thus, the scattering patterns 240 may be fully embedded or buried in the transparent substrate 211.

Subsequently, a process substantially identical to or similar to that described with reference to FIG. 7 may be performed. Accordingly, a structure including the transparent substrate 211 and the scattering patterns 240 completely buried therein may be separated from the carrier film 205. At least a portion of the structure may be utilized as an optical sheet in accordance with example embodiments. For example, the optical sheet may have a structure substantially identical to or similar to that described with reference to FIG. 3. In example embodiments, the scattering patterns 240 may be substantially and/or completely buried in the transparent substrate 211. In example embodiments, a planarization process or a plasma treatment process may be performed on the upper and/or lower surfaces of the optical sheet.

According to example embodiments described with reference to FIGS. 4 to 12, the scattering patterns 240 may be randomly placed in a non-periodic arrangement, and then the transparent substrate 210 may be coated on the scattering patterns 240.

In accordance with example embodiments, a transparent substrate may be patterned, and then scattering patterns may be inserted or injected into the transparent substrate at random positions and/or in a non-periodic arrangement to obtain an optical sheet.

In example embodiments, the above mentioned transparent polymer layer may be formed through a roll-to-roll process. Engraved patterns (e.g., slots or through-holes) may be randomly formed in the transparent polymer layer using, e.g., a slot die, a cutter, or a knife. Scattering layers and scattering particles may be filled in the engraved patterns to form the optical sheet. A UV radiation or a heat press may be performed to cure the transparent polymer layer. A plasma treatment process may be performed to remove defects such as protrusion or recesses of the optical sheet.

In some example embodiments, a molding roller may be utilized so that the engraved patterns may be formed during formation of the transparent polymer film.

Figure 13:
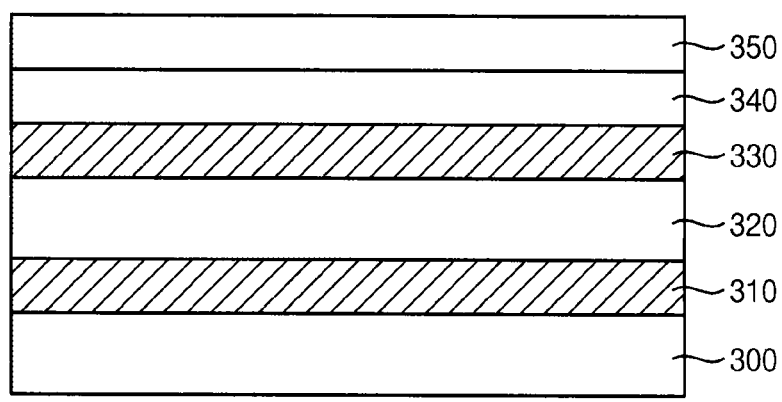
FIG. 13 is a cross-sectional view illustrating a display device in accordance with example embodiments of the present invention.

FIG. 13 is a cross-sectional view illustrating a display device in accordance with example embodiments of the present invention. The display device may represent an OLED device, an LCD device, or a flexible display device that includes one or more of the optical sheets described above in example embodiments.

Referring to FIG. 13, the display device may include a first electrode 310, an organic light emitting layer 320 (hereinafter referred to as an EML 320), a second electrode 330, and an optical sheet 340 sequentially stacked on a substrate 300. In example embodiments, the display device may further include a polarization film 350.

The substrate 300 may include a transparent insulation substrate. For example, the substrate 300 may be (or may include) a glass substrate. As another example, the substrate 300 may be (or may include) a transparent plastic substrate including, e.g., PET, PEN (polyethylene naphthalate). or polyimide. As another example, the substrate 300 may be (or may include) a transparent metal oxide substrate. A structure (not illustrated) including a switching device and an insulation layer may be disposed on the substrate 300. A wiring structure including a data line and a gate line may be disposed on the substrate 300. The switching device may include a thin film transistor (TFT) device and/or a semiconductor oxide device.

The first electrode 310 may include a transparent conductive material such as indium tin oxide (ITO), zinc tin oxide (ZTO), indium zinc oxide (IZO), zinc oxide (ZnOx), or tin oxide (SnOx). Alternatively or additionally, the first electrode 310 may include a metal such as chrome (Cr), aluminum (Al), tantalum (Ta), molybdenum (Mo), titanium (Ti), tungsten (W), copper (Cu), silver (Ag), neodymium (Nd), or an alloy of some of these metals. In example embodiments, the first electrode 310 may serve as a reflective electrode and may include a metal and/or an alloy. In example embodiments, the first electrode 310 may serve as a pixel electrode of the display device and/or an anode for providing the EML 320 with holes. The first electrode 310 may be formed on the substrate 300 using one or more of a sputtering process, a chemical vapor deposition (CVD) process, an atomic layer deposition (ALD) process, a vacuum evaporation process, a printing process, a pulse laser deposition (PLD) process, etc. The first electrode 310 may be patterned according to each pixel.

The EML 320 may include at least one light emitting material for generating light of a predetermined color, for example, a red light, a green light, or a blue light, in each pixel. In some example embodiments, an EML 320 may include a mixture of light emitting materials for generating a white light.

In example embodiments, a hole transport layer (HTL) (not illustrated) may be disposed between the first electrode 310 and the EML 320. The HTL may include a hole transport material, for example, 4,4'-bis[N-(1-naphtyl)-N-phenylamino]biphenyl (NPB), 4,4'-bis[N-(3-methylphenyl)-N-phenylamino]biphenyl (TPD), N,N'-di-1-naphtyl-N,N'-diphenyl-1,1'-biphenyl-4,4'-diamine (NPD), N-phenylcarbazole, polyvinylcarbazole, or a mixture some of these materials.

In example embodiments, an electron transport layer (ETL) (not illustrated) may be disposed on the EML 320. The ETL may include an electron transport material, for example, tris(8-quinolinolato)aluminum (Alq3), 2-(4-biphenylyl)-5-4-tert-butylphenyl-1,3,4-oxadiazole (PBD), bis(2-methyl-8-quinolinolato)-4-phenylphenolato-aluminum (BAlq), bathocuproine (BCP), or a mixture of some of these materials.

The EML 320, the HTL, and the ETL may be formed using one or more of a spin coating process, a roll printing process, a nozzle printing process, an inkjet printing process, a transfer process using a donor substrate, etc. The EML 320, the HTL, and the ETL may be formed continuously along a substantially entire surface of the display device or may be patterned in each pixel.

The second electrode 330 may include a metal such as Li, Ca, lithium fluoride/calcium (LiF/Ca), LiF/Al, Al, Mg, Ag, Cr, W, Mo, Ti, or an alloy of some of these materials. In example embodiments, the second electrode 330 may include a transparent conductive material such as ITO, IZO, ZTO, tin oxide, or zinc oxide. The second electrode 330 may serve as a cathode for providing the EML 320 with electrons.

The second electrode 330 may be formed using one or more of a CVD process, an ALD process, a vacuum evaporation process, a printing process, a PLD process, etc.

A light emitting structure of the display device may be defined by the first electrode 310, the EML 320, and the second electrode 330, and the optical sheet 340 may be disposed on the light emitting structure.

The optical sheet 340 may have a structure substantially identical to or similar to one or more of the structures described with reference to FIGS. 1A and 1B, FIG. 2, and FIG. 3. The optical sheet 340 may minimize color-shift of the display device without substantially deteriorating brightness of images displayed by the display device. The optical sheet 340 may be manufactured using one or more of the methods described with reference to FIGS. 4 to 12.

In example embodiments, the polarization film 350 may be disposed on the optical sheet 340. In example embodiments, the polarization film 350 may be disposed between the light emitting structure and the optical sheet 340. The polarization film 350 may include, e.g., polyvinyl alcohol (PVA). An external light incident to the display device may be processed by the polarization film 350 to prevent visibility reduction of displayed images.

A protection layer and/or an upper transparent substrate may be disposed on the polarization film 350.

Visibility enhancement implemented using the optical sheet in accordance with example embodiments is described with reference to an Experimental Example.

EXPERIMENTAL EXAMPLE

An optical sheet having a thickness of 80 μm was prepared using TAC. Scattering patterns were not formed in the optical sheet (hereinafter referred to as the optical sheet of the Comparative Example). Scattering patterns were randomly formed in a transparent substrate including TAC with a thickness of 80 μm (hereinafter referred to as the optical sheet of an Embodiment Example). The scattering patterns were formed by dispersing silica particles as scattering particles in a binder resin including polyimide.

A value of Wba/Waa in the optical sheet of the Embodiment Example was fixed to 1/20 (specifically, Wba is 2 μm and Waa is 40 μm), and color-shift improvement ratios and transmittances of the optical sheets of Embodiment Examples were measured with various weight percent values of the scattering particles with respect to a total weight of the scattering patterns (wt %). Specifically, color-shifts (duv) according to viewing angles were measured for a display device that includes the optical sheet of the Comparative Example and for display devices that include optical sheets of Embodiment Examples. A reduction percentage of the color-shift at the viewing angle of 70° of an Embodiment Example relative to the Comparative Example was determined as the color-shift improvement ratio. The measured results are shown in Table 1 below.

TABLE 1

| | wt % | | | | | |
|---|---|---|---|---|---|---|
| | 3 | 5 | 10 | 20 | 25 | 40 |
| Color-shift Improvement ratio (%) | 10 | 26 | 30 | 40.5 | 45 | 46 |
| Transmittance (%) | 98 | 97 | 96 | 95 | 93 | 90 |

Referring to Table 1, as the weight percent of the scattering particles was increased with the value of Wba/Waa being maintained constant, the color-shift improvement ratio increased, and the transmittance decreased. Particularly, when the weight percent of the scattering particles was in a range of from about 5 wt % to about 40 wt %, the color-shift was improved by more than about 25% and the transmittance was maintained at least 90%. Thus, in the weight percent range, the color-shift of the display device may be significantly improved without a front brightness being substantially compromised. When the weight percent of the scattering particles was in a range of from about 5 wt % to about 20 wt %, the color-shift was improved by more than about 25% and the transmittance was maintained at least 95%.

The color-shift improvement ratios and the transmittances of optical sheets of Embodiment Examples were measured for various combinations of the optical sheet thickness, the weight percent of the scattering particles, and the value of Wba/Waa. The measured results are shown in Table 2 below.

TABLE 2

| | Thickness T (μm) | wt % | Wba/Waa | T*(wt %)* (Wba/Waa) (μm %) | Color-shift Improvement ratio (%) | Transmittance (%) |
|---|---|---|---|---|---|---|
| 1 | 50 | 5 | 1/20 (2 um/40 um) | 12.5 | 17 | 98.7 |
| 2 | 50 | 10 | 1/20 (2 um/40 um) | 25 | 17 | 97.4 |
| 3 | 80 | 10 | 1/20 (2 um/40 um) | 40 | 30 | 96.0 |
| 4 | 50 | 20 | 1/20 (2 um/40 um) | 50 | 31 | 96.0 |
| 5 | 80 | 5 | 1/5 (8 um/40 um) | 80 | 38 | 95.6 |
| 6 | 80 | 10 | 1/10 (4 um/40 um) | 80 | 38 | 95.7 |
| 7 | 80 | 20 | 1/20 (2 um/40 um) | 80 | 40.5 | 95.0 |
| 8 | 50 | 5 | 13/40 | 81.25 | 38.4 | 95.3 |
| 9 | 50 | 10 | 6.5/40 | 81.25 | 38.7 | 95.2 |
| 10 | 50 | 20 | 3.5/40 | 87.5 | 39.5 | 95.1 |
| 11 | 50 | 5 | 15/40 | 93.75 | 40 | 93.0 |
| 12 | 80 | 10 | 5/40 | 100 | 42 | 91.0 |
| 13 | 80 | 10 | 6.5/40 | 130 | 45 | 90 |

Referring to Table 2, as the multiplying value of the thickness of the optical sheet (T), the weight percent of the scattering particles (wt %), and Wba/Waa (hereinafter referred to as T*(wt %)*(Wba/Waa)) was increased, the color-shift improvement ratio increased, and the transmittance decreased.

As shown in Table 2, when the value of T*(wt %)*(Wba/Waa) was in a range of from about 80 to about 100, significant color-shift improvement ratio of nearly 40% was obtained, and the transmittance was maintained above about 90%.

When the value of T*(wt %)*(Wba/Waa) was in a range of from about 80 to about 87.5, significant color-shift improvement ratio of nearly 40% was obtained, and the transmittance was maintained above about 95%.

According to embodiments of the invention, an optical sheet having the value of T*(wt %)*(Wba/Waa) in the range of 80 to 87.5 may provide substantial color-shift improvement for the display device without substantially reducing brightness of displayed images.

The foregoing is illustrative of example embodiments and is not to be construed as limiting. Although a few example embodiments have been described, those skilled in the art will readily appreciate that many modifications are possible without materially departing from the scope of the present invention. Modifications to the example embodiments are intended to be included within the scope of the present invention defined in the claims.

What is claimed is:

1. An optical sheet comprising:
a transparent substrate; and
light-scattering elements randomly and nonperiodically distributed in the transparent substrate and completely surrounded by the transparent substrate in a plan view of the optical sheet, wherein each light-scattering element of the light scattering elements includes a binding-material member and light-scattering particles dispersed in the binding-material member, wherein a first light-scattering element among the light-scattering elements is larger than a second light-scattering element among the light-scattering elements, and wherein a circular circumference of a binding-material member of the first light-scattering element is larger than a circular circumference of a binding-material member of the second light-scattering element.

2. The optical sheet of claim 1, wherein a weight percent calculated from dividing a total weight of light-scattering particles of the light-scattering elements by a total weight of the light-scattering elements is in a range of 5 wt % to 20 wt %.

3. The optical sheet of claim 1, wherein a ratio calculated from dividing an average width of the light-scattering elements in cross-sections of the optical sheet by an average distance of immediately neighboring light-scattering elements of the light-scattering elements in cross-sections of the optical sheet is in a range of 1/20 to 3/8.

4. The optical sheet of claim 1, wherein a weight percent calculated from dividing a total weight of light-scattering particles of the light-scattering elements by a total weight of the light-scattering elements is in a range of 5 wt % to 40 wt %, wherein a unit of a thickness value of the optical sheet is µm, and wherein a configuration value calculated from dividing a product of the thickness value of the optical sheet, a value of the weight percent, and an average width of the light-scattering elements by an average distance of immediately neighboring light-scattering elements of the light-scattering elements is in a range of 80 to 100.

5. The optical sheet of claim 4, wherein the configuration value is in a range of 80 to 90.

6. The optical sheet of claim 1, wherein top surfaces of the light-scattering elements are flush with a top surface of the transparent substrate, and wherein bottom surfaces of the light-scattering elements are flush with a bottom surface of the transparent substrate.

7. The optical sheet of claim 1, wherein a total quantity of light-scattering particles of the first light-scattering element in the plan view of the optical sheet is greater than a total quantity of light-scattering particles of the second light-scattering element in the plan view of the optical sheet.

8. The optical sheet of claim 1, wherein a total area of a binding-material member of the first light-scattering element in the plan view of the optical sheet is greater than a total area of a binding-material member of the second light-scattering element in the plan view of the optical sheet.

9. A display device comprising:
a first electrode;
an organic light emitting layer overlapping the first electrode;
a second electrode overlapping the organic light emitting layer;
a polarization film; and
an optical sheet overlapping the second electrode, the optical sheet comprising:
a transparent substrate; and
light-scattering elements randomly and nonperiodically distributed in the transparent substrate and completely surrounded by the transparent substrate in a plan view of the optical sheet, wherein each light-scattering element of the light scattering elements includes a binding-material member and light-scattering particles dispersed in the binding-material member, wherein a maximum width of a first light-scattering element among the light-scattering elements in the plan view of the optical sheet is larger than a maximum width of a second light-scattering element among the light-scattering elements in the plan view of the optical sheet, and wherein a circular circumference of a binding-material member of the first light-scattering element is larger than a circular circumference of the second light-scattering element in the plan view of the optical sheet.

10. The display device of claim 9, wherein a weight percent calculated from dividing a total weight of light-scattering particles of the light-scattering elements by a total weight of the light-scattering elements is in a range of 5 wt % to 40 wt %, wherein a unit of a thickness value of the optical sheet is µm, and wherein a configuration value calculated from dividing a product of the thickness value of the optical sheet, a value of the weight percent, and an average width of the light-scattering elements by an average distance of immediately neighboring light-scattering elements of the light-scattering elements is in a range of 80 to 100.

* * * * *